United States Patent
Yang et al.

(10) Patent No.: US 11,974,424 B2
(45) Date of Patent: Apr. 30, 2024

(54) MEMORY DEVICE AND METHOD OF FORMING THE SAME

(71) Applicant: Winbond Electronics Corp., Taichung (TW)

(72) Inventors: Chung-Ming Yang, Taichung (TW); Shu-Ming Li, Taichung (TW)

(73) Assignee: Winbond Electronics Corp., Taichung (TW)

( * ) Notice: Subject to any disclaimer, the term of this patent is extended or adjusted under 35 U.S.C. 154(b) by 45 days.

(21) Appl. No.: 17/537,544

(22) Filed: Nov. 30, 2021

(65) Prior Publication Data
US 2023/0171943 A1    Jun. 1, 2023

(51) Int. Cl.
*H10B 12/00* (2023.01)

(52) U.S. Cl.
CPC ......... *H10B 12/09* (2023.02); *H10B 12/0335* (2023.02); *H10B 12/315* (2023.02); *H10B 12/50* (2023.02)

(58) Field of Classification Search
CPC .. H10B 12/09; H10B 12/0335; H10B 12/315; H10B 12/50
See application file for complete search history.

(56) References Cited

U.S. PATENT DOCUMENTS

| | | | |
|---|---|---|---|
| 6,709,919 B2 | 3/2004 | Tu | |
| 2005/0230729 A1* | 10/2005 | Won | H10B 12/033 257/296 |
| 2006/0286802 A1* | 12/2006 | Yu | H01L 29/665 257/E21.334 |
| 2012/0091520 A1* | 4/2012 | Nakamura | H10B 12/053 257/303 |
| 2013/0147013 A1 | 6/2013 | Ode | |
| 2014/0103335 A1* | 4/2014 | Yamazaki | H01L 29/78648 257/43 |
| 2014/0103491 A1* | 4/2014 | Kim | H01L 28/60 257/532 |
| 2018/0212166 A1* | 7/2018 | May | H10K 85/40 |

(Continued)

FOREIGN PATENT DOCUMENTS

| | | |
|---|---|---|
| CN | 102117776 | 3/2013 |
| TW | 201316433 | 4/2013 |
| TW | 201322373 | 6/2013 |

OTHER PUBLICATIONS

Office Action of Taiwan Counterpart Application, dated Oct. 11, 2022, p. 1-p. 5.

*Primary Examiner* — Edward Chin
(74) *Attorney, Agent, or Firm* — JCIPRNET

(57) ABSTRACT

Provided is a memory device including a substrate, a plurality of landing pads, a protective layer, a filling layer, a plurality of cup-shaped lower electrodes, a capacitor dielectric layer, and an upper electrode. The landing pads are disposed on the substrate. The protective layer conformally covers sidewalls of the landing pads. The filling layer is laterally disposed between the landing pads, wherein the filling layer has a top surface higher than a top surface of the landing pads. The cup-shaped lower electrodes are respectively disposed on the landing pads. The capacitor dielectric layer covers a surface of the cup-shaped lower electrodes. The upper electrode covers a surface of the capacitor dielectric layer. A method of forming a memory device is also provided.

20 Claims, 14 Drawing Sheets

(56) References Cited

U.S. PATENT DOCUMENTS

| | | | |
|---|---|---|---|
| 2019/0140069 A1* | 5/2019 | Lin ........................ | H10B 12/09 |
| 2020/0243376 A1* | 7/2020 | Ku ......................... | H10B 12/09 |
| 2021/0066446 A1* | 3/2021 | Lee ....................... | H10B 12/033 |
| 2021/0074825 A1* | 3/2021 | Sharma ................. | H01L 29/872 |
| 2021/0265355 A1* | 8/2021 | Sharma ................. | H10N 70/826 |
| 2021/0272961 A1* | 9/2021 | Tung ..................... | H10B 12/485 |
| 2021/0287991 A1* | 9/2021 | Sun ........................ | H10B 43/10 |
| 2022/0068929 A1* | 3/2022 | Karda ................... | H01L 21/02603 |
| 2022/0084943 A1* | 3/2022 | Cho ....................... | H10B 12/033 |
| 2022/0122977 A1* | 4/2022 | Kim ....................... | H10B 12/30 |
| 2022/0130834 A1* | 4/2022 | Lee ....................... | H10B 12/056 |
| 2022/0139836 A1* | 5/2022 | Son ....................... | H01L 21/76895 |
| | | | 257/296 |
| 2022/0238700 A1* | 7/2022 | Huang ............. | H01L 21/823842 |
| 2022/0285353 A1* | 9/2022 | Cho ....................... | H10B 12/482 |
| 2023/0055450 A1* | 2/2023 | Choo ..................... | H01L 28/75 |
| 2023/0093872 A1* | 3/2023 | Cho ....................... | H10B 12/315 |
| | | | 257/296 |

* cited by examiner

MEMORY DEVICE AND METHOD OF FORMING THE SAME

BACKGROUND OF THE INVENTION

Field of the Invention

The present invention relates to a memory device and a method of forming the same.

Description of Related Art

With the progress of technology, electronic products are being developed toward having the features of high speed, high efficiency, light weight, and small size. On the other hand, the requirement of having higher capacitance for a dynamic random access memory is also increased. Therefore, designs of dynamic random access memories are also being developed to have high integrity and high density. However, the horizontal arrangement of memory cells of a high-integrity dynamic random access memory is very close, and therefore the capacitor area almost cannot be increased in the horizontal direction.

SUMMARY OF THE INVENTION

The invention provides a memory device including a substrate, a plurality of landing pads, a protective layer, a filling layer, a plurality of cup-shaped lower electrodes, a capacitor dielectric layer, and an upper electrode. The plurality of landing pads are disposed on the substrate. The protective layer conformally covers sidewalls of the plurality of landing pads. The filling layer is laterally disposed between a plurality of landing pads, wherein a top surface of the filing layer is higher than a top surface of the plurality of landing pads. The plurality of cup-shaped lower electrodes are respectively disposed on the plurality of landing pads. The capacitor dielectric layer covers a surface of the plurality of cup-shaped lower electrodes. The upper electrode covers a surface of the capacitor dielectric layer.

The invention provides a method of forming a memory device including: providing a substrate having a first region and a second region; forming a first layered stack on the substrate in the first and second regions, wherein the first layered stack comprises a metal material layer, a first carbon material layer, a first dielectric material layer, a second carbon material layer, and a second dielectric material layer; patterning the first layered stack to form a plurality of first stack-layered structures on the substrate in the first region, wherein each first stack-layered structure comprises a metal layer, a first carbon layer, and a first dielectric layer; performing an atomic layer deposition (ALD) process on the plurality of first stack-layered structures to form a protective layer conformally covering a surface of the plurality of first stack-layered structures; forming a filling layer on the protective layer to fill in a space between the plurality of first stack-layered structures; forming a second layered stack on the substrate in the first and second regions; patterning the second layered stack to form a plurality of openings in the first region, wherein the plurality of openings respectively expose a plurality of metal layers of the plurality of first stack-layered structures; and performing a capacitor formation process to form a plurality of capacitors in the plurality of openings.

Based on above, in the embodiment of the present invention, the height of the filling layer is increased by adding the first layered stack with additional carbon material layer and dielectric material layer. In this case, the capacitor dielectric layer can not only conformally cover the surface of the upper support layer, the surface of the middle support layer, and the surface of the lower support layer, but also further extends to cover a portion of the surface of the filling layer, so as to enhance the capacitor area in the vertical direction, thereby enhancing the capacitance of the memory device.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
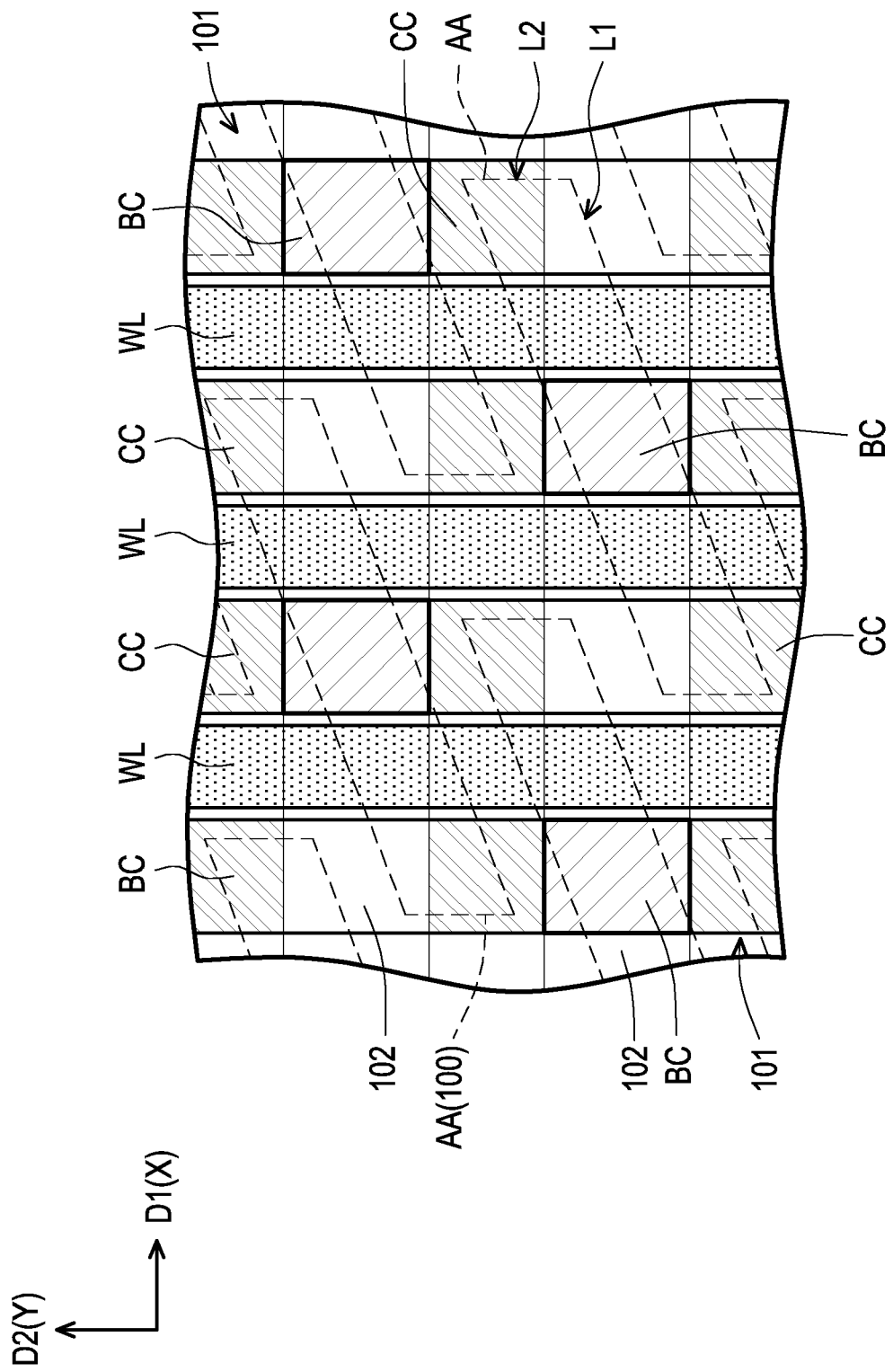
FIG. 1 is a schematic top view of a memory device according to an embodiment of the invention.

As shown in FIG. 1, a substrate 100 includes a plurality of active areas AA. In an embodiment, the active areas AA may be formed by forming isolation structures 101 in the substrate 100 to define the substrate 100 as the plurality of active areas AA. In other words, one isolation structures 101 is provided between two adjacent active areas AA. In one embodiment, one memory cell is only formed on one active area AA, and each memory cell is separated by the isolation structures 101, so as to effectively reduce the interference issue among the memory cells.

A plurality of bit-line structures 102 are located on the substrate 100 and across the active areas AA. In one embodiment, the bit-line structures 102 extend along a first direction D1 (e.g., X direction) and are arranged with each other along a second direction D2 (e.g., Y direction). A plurality of embedded word lines WL are located in the substrate 100. In one embodiment, the embedded word lines WL extend along the second direction D2 (e.g., Y direction) and are arranged with each other along the first direction D1 (e.g., X direction). In the embodiment, the first direction D1 and the second direction D2 are substantially perpendicular to each other.

As shown in FIG. 1, each active area AA has a long side L1 and a short side L2, and the long side L1 spans the corresponding two embedded word lines WL and one bit-line structure 102. An overlap of each active area AA and its corresponding bit-line structure 102 has a bit-line contact BC. In this case, the bit-line contacts BC may be used to electrically connect the bit-line structures 102 and the doped regions (not shown) in the corresponding active areas AA. The doped region may be located between two embedded word lines WL.

A plurality of capacitor contacts CC are respectively disposed in the space surrounded by the embedded word lines WL and the bit-line structures 102. In detail, the capacitor contacts CC are respectively disposed on the two terminals of the long side L1 of the active areas AA, which may be electrically connected to the active areas AA and subsequently formed capacitors (not shown). In addition, although the capacitor contacts CC are shown in a rectangular shape in FIG. 1, the actually formed contacts is slightly represented in a circular shape and sizes thereof may be designed based on process requirements.

FIG. 2A to FIG. 2M are schematic cross-sectional views of a manufacturing process of a memory device according to an embodiment of the invention.

Figure 2A:
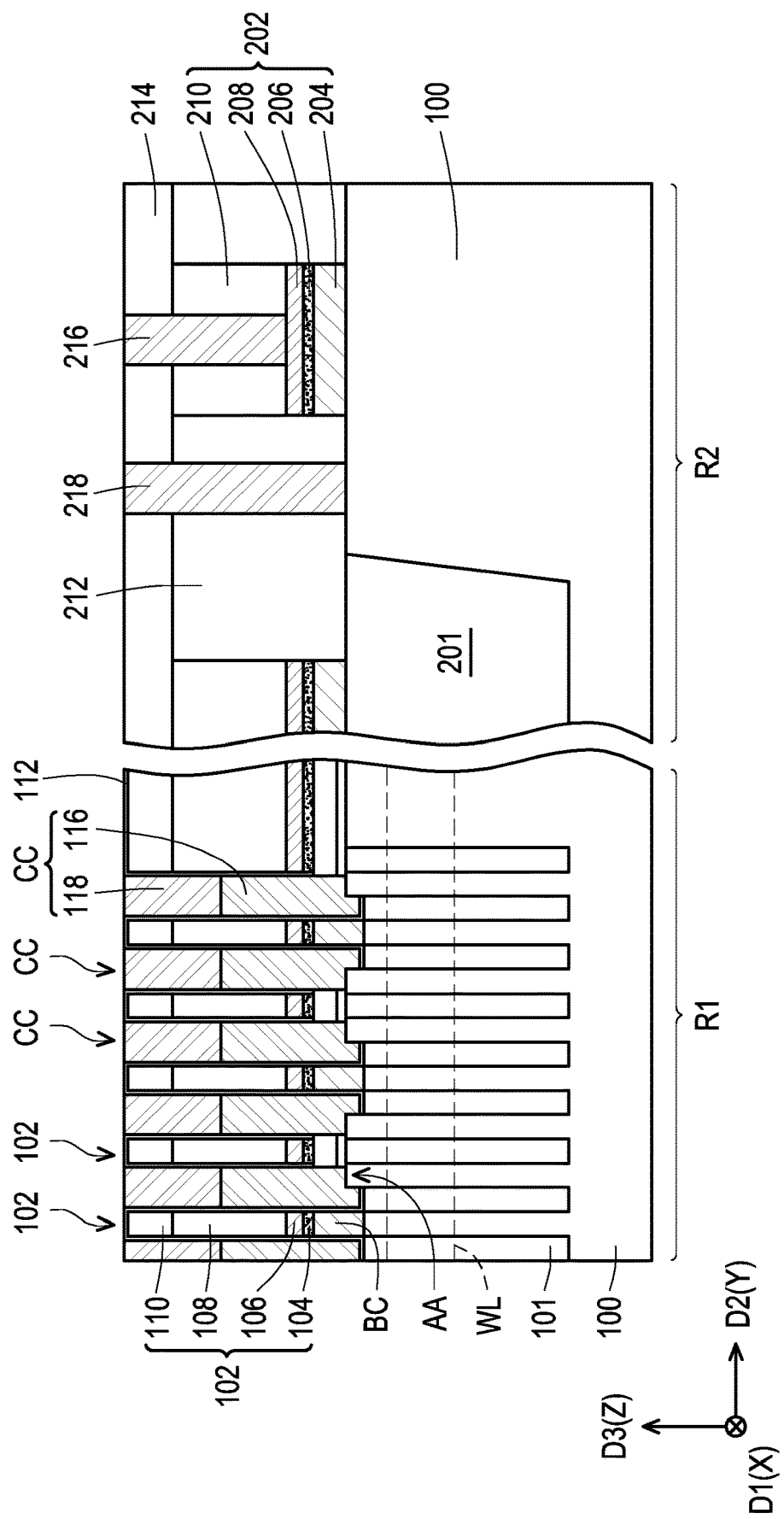
FIG. 2A to FIG. 2M are schematic cross-sectional views of a manufacturing process of a memory device according to an embodiment of the invention.

First, referring to FIG. 2A, an initial structure is provided to include a substrate 100, a plurality of isolation structures 101, a plurality of bit-line structures 102, a plurality of gate structures 202, and a plurality of capacitor contacts CC. In one embodiment, the substrate 100 may be a silicon substrate. Specifically, the substrate 100 may include a first region R1 and a second region R2. In the embodiment, the first region R1 may be a memory array region, and the second region may be a peripheral circuit region.

As shown in FIG. 2A, the isolation structures 101 are disposed in the substrate 100 of the first region R1 to divide the substrate 100 into a plurality of active areas AA. In addition, the isolation structures 201 are disposed in the substrate 100 of the second region R2.

As shown in FIG. 2A, the bit-line structures 102 are disposed in parallel on the substrate 100 in the first region R1 and traverse the active areas AA. In an embodiment, the bit-line structures 102 extend along the first direction D1 (e.g., X direction), and are arranged alternately along the second direction D2 (e.g., Y direction). Specifically, each bit-line structure 102 is a stack structure including a barrier layer 104, a bit line 106, a cap layer 108, and a mask layer 110 or the like along the third direction D3 (e.g., Z direction). It should be noted that, as shown in FIG. 2A, the initial structure may further include a plurality of bit-line contacts BC. The bit-line contact BC is disposed at an overlap of each active area AA and the corresponding bit-line structure 102. Therefore, each bit-line structure 102 may be electrically connected to the corresponding active areas AA by using the bit-line contact BC.

In an embodiment, a material of the barrier layer 104 includes a barrier metal material, such as Ti, TiN, Ta, TaN, or a combination thereof, for example. A material of the bit line 106 may be a metal material, such as W, for example. In addition, there may also be a thin metal silicide layer, such as tungsten silicide ($WSi_x$), between the barrier layer 104 and the bit line 106. A material of the cap layer 108 may be silicon nitride. A material of the mask layer 110 may be silicon oxide, carbon, silicon oxynitride, or a combination thereof. In the embodiment, the mask layer 110 may be a hard mask layer with a multi-layered structure, but the present invention is not limited thereto. A material of the bit-line contacts BC may include a conductive material, such as doped polysilicon or silicon germanium.

As shown in FIG. 2A, a plurality of capacitor contacts CC may be disposed between the bit-line structures 102 to be electrically connected to the active areas AA. Specifically, each capacitor contact CC may include a conductive layer 116 and a metal layer 118. The conductive layer 116 may be in contact with the active area AA, and the metal layer 118 is disposed on the conductive layer 116. In an embodiment, a material of the conductive layer 116 includes polysilicon, and a material of the metal layer 118 may be W, for example. In addition, there may also be a thin metal silicide layer, such as tungsten silicide ($WSi_x$), between the conductive layer 116 and the metal layer 118.

In addition, the initial structure further includes a liner layer 112 disposed between the bit-line structures 102 and the capacitor contacts CC. Specifically, the liner layer 112 may conformally cover a surface of the bit-line structures 102 to protect the bit-line structures 102, as shown in FIG. 2A. In one embodiment, a material of the liner layer 112 includes a dielectric material, such as silicon oxide, silicon nitride, silicon oxynitride, or a combination thereof, for example.

On the other hand, a plurality of gate structures 202 are disposed on the substrate 100 in the second region R2. Specifically, each gate structure 202 may sequentially include a polysilicon layer 204, a barrier layer 206, a metal layer 208, and a cap layer 210 along the third direction D3. The gate structures 202 further include dielectric layers 212, 214 and contacts 216, 218. The dielectric layer 212 is laterally disposed between the gate structures 202, and the dielectric layer 214 is disposed on the dielectric layer 212 and the gate structures 202. In an embodiment, the dielectric layers 212 and 214 may have different materials. For example, the dielectric layer 212 may be a silicon oxide layer, and the dielectric layer 214 may be a silicon nitride layer. Although the dielectric layer 212 illustrated in FIG. 2A is in direct contact with the gate structures 202, the present invention is not limited thereto. In other embodiments, there may be one or more spacers between the gate structures 202 and the dielectric layer 212 to protect the sidewalls of the gate structures 202.

As shown in FIG. 2A, the contact 216 may penetrate through the dielectric layer 214 and the cap layer 210 to contact the metal layer 208, or further extend into the polysilicon layer 204. In such embodiment, the contact 216 may be referred to as a gate contact. On the other hand, the contact 218 may penetrate through the dielectric layers 214 and 212 to contact the doped regions (not shown) in the substrate 100. In such embodiment, the contact 218 may be referred to as a source/drain (S/D) contact. In an embodiment, a material of the contacts 216 and 218 includes a metal material, such as W. In addition, there may also be a thin metal silicide layer, such as tungsten silicide ($WSi_x$), between the contact 216 and the polysilicon layer 204 or between the contact 218 and the substrate 100.

Figure 2B:
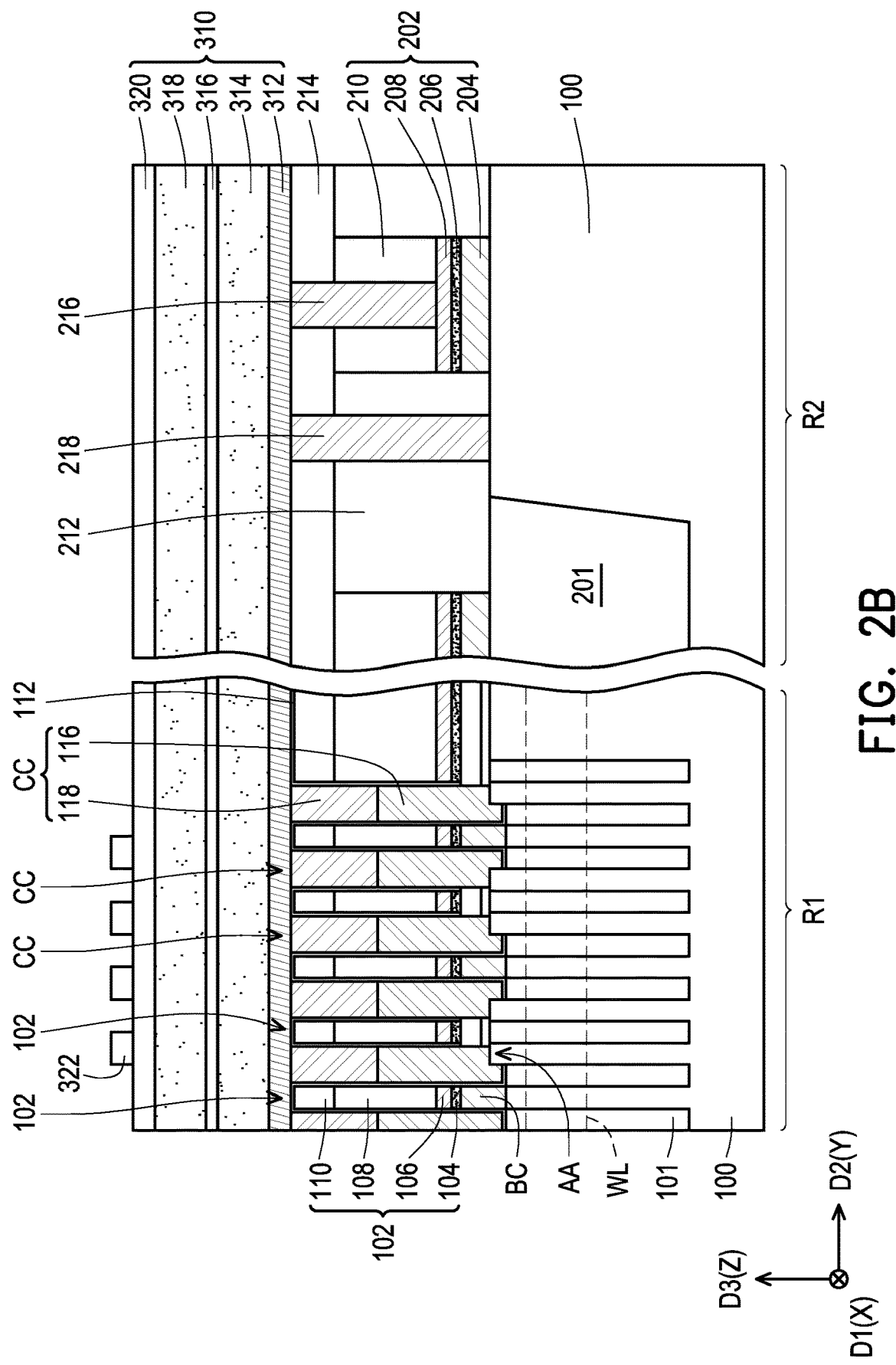

Referring to FIG. 2B, a first layered stack 310 is formed on the substrate 100 in the first region R1 and the second region R2. Specifically, the first layered stack 310 includes a metal material layer 312, a first carbon material layer 314, a first dielectric material layer 316, a second carbon material layer 318, and a second dielectric material layer 320 in order from bottom to top. In an embodiment, the metal material layer 312 may be W. The first carbon material layer 314 and the second carbon material layer 318 may have the same material, such as carbon. The first dielectric material layer 316 and the second dielectric material layer 320 may have different materials. For example, the first dielectric material layer 316 may be a SiON layer, and the second dielectric material layer 320 may be a SiN layer. Next, a mask pattern 322 is formed on the first layered stack 310 in the first region R1. In one embodiment, a material of the mask pattern 322 includes oxide, such as silicon oxide.

Figure 2C:
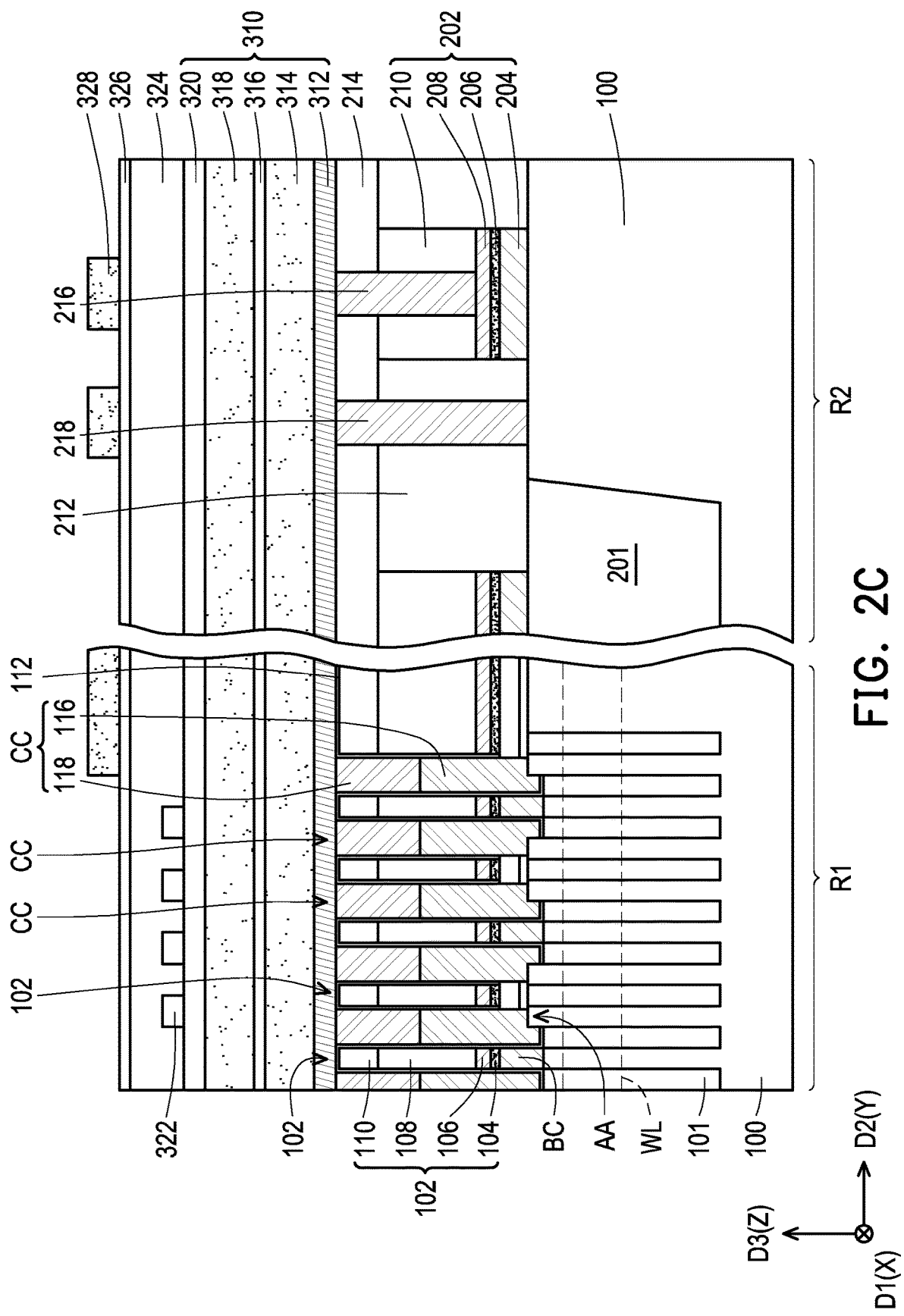

Referring to FIG. 2C, a flat layer 324, an anti-reflection layer 326, and a photoresist layer 328 are sequentially formed on the first layered stack 310 in the first region R1 and the second region R2. In an embodiment, a material of the flat layer 324 includes spin-on carbon (SOC). A material of the anti-reflection layer 326 includes spin on silicon anti-reflection coating (SOSA). The photoresist layer 328 includes a positive photoresist or a negative photoresist.

Figure 2D:
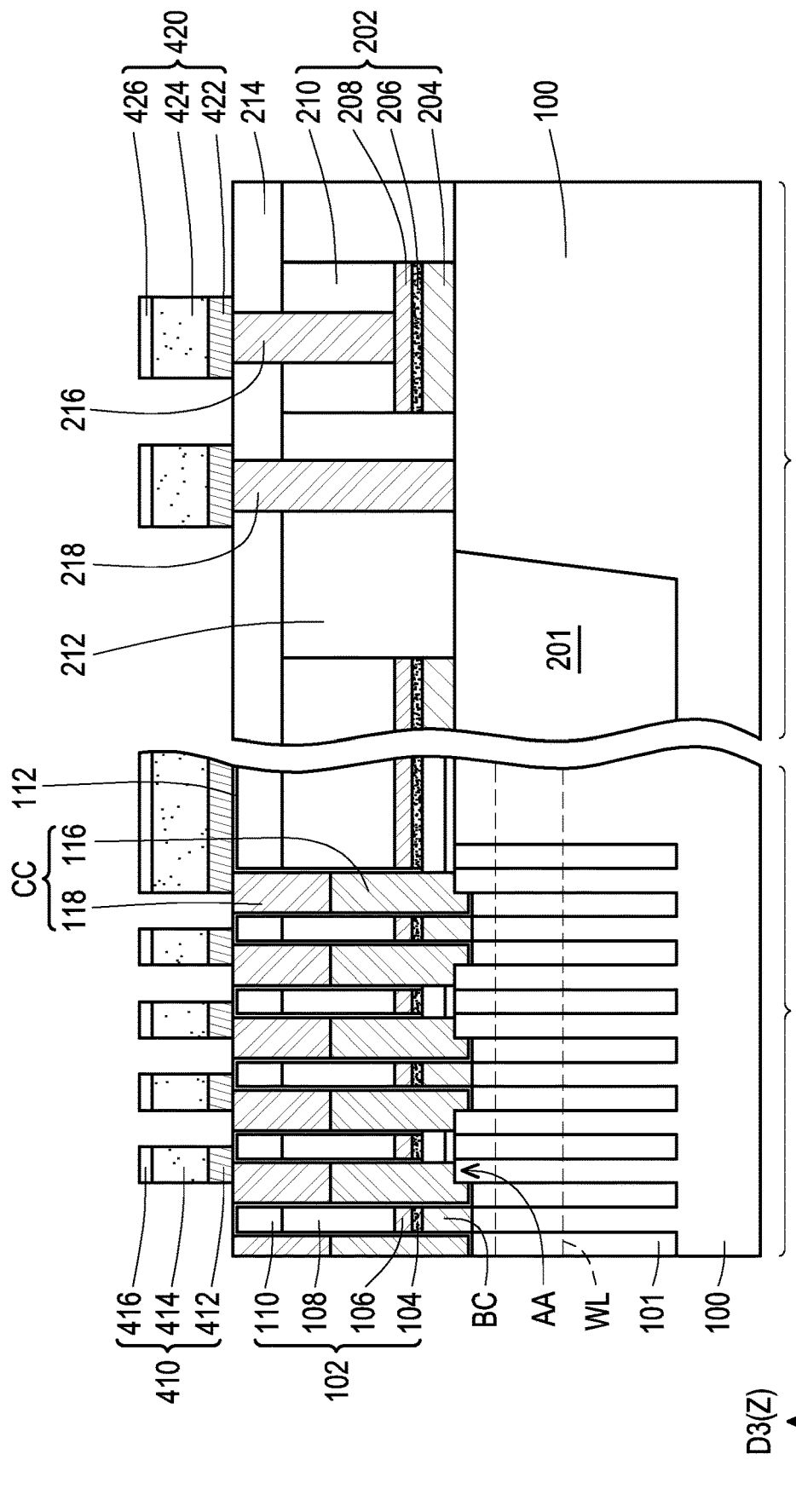

Referring to FIG. 2C and FIG. 2D, a patterning process is performed to pattern the first layered stack 310, thereby forming a plurality of first stack-layered structures 410 and a plurality of second stack-layered structures 420. Specifically, the first stack-layered structures 410 are formed on the substrate 100 in the first region R1, and the second stack-layered structures 420 are formed on the substrate 100 in the second region R2. Each first stack-layered structure 410 includes a metal layer 412, a first carbon layer 414, and a first dielectric layer 416 in order from bottom to top. Each second stack-layered structure 420 includes a metal layer 422, a first carbon layer 424, and a first dielectric layer 426 in order from bottom to top. Since the first stack-layered structures 410 and the second stack-layered structures 420 are formed by the same patterning process, the first stack-layered structures 410 and the second stack-layered structures 420 may be located at the same level. In one embodiment, the patterning process may include a self-alignment double patterning (SADP) process to increase the pattern density of the first stack-layered structures 410. In this case, the first stack-layered structures 410 may be aligned with and contact the capacitor contacts CC in the first region R1, so that the capacitor contacts CC is electrically connected to the capacitors formed subsequently.

Figure 2E:
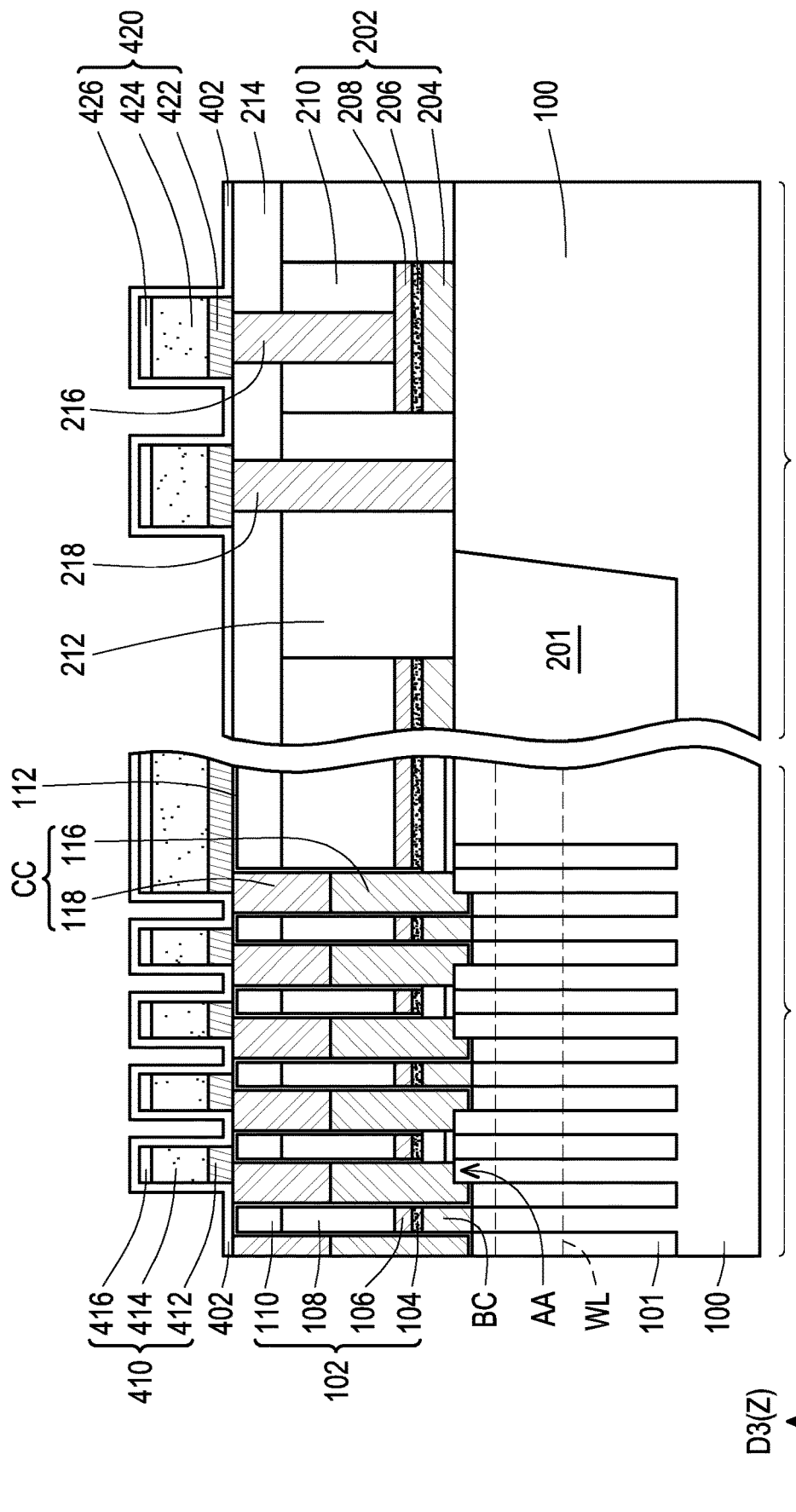

Referring to FIG. 2E, an atomic layer deposition (ALD) process is performed to form a protective material layer 402 on the surfaces of the first stack-layered structures 410 and the second stack-layered structures 420, so that the protective material layer 402 conformally covers the surface of the structure illustrated in FIG. 2D. In one embodiment, the protective material layer 402 includes an ALD oxide layer, such as ALD silicon oxide.

Figure 2F:
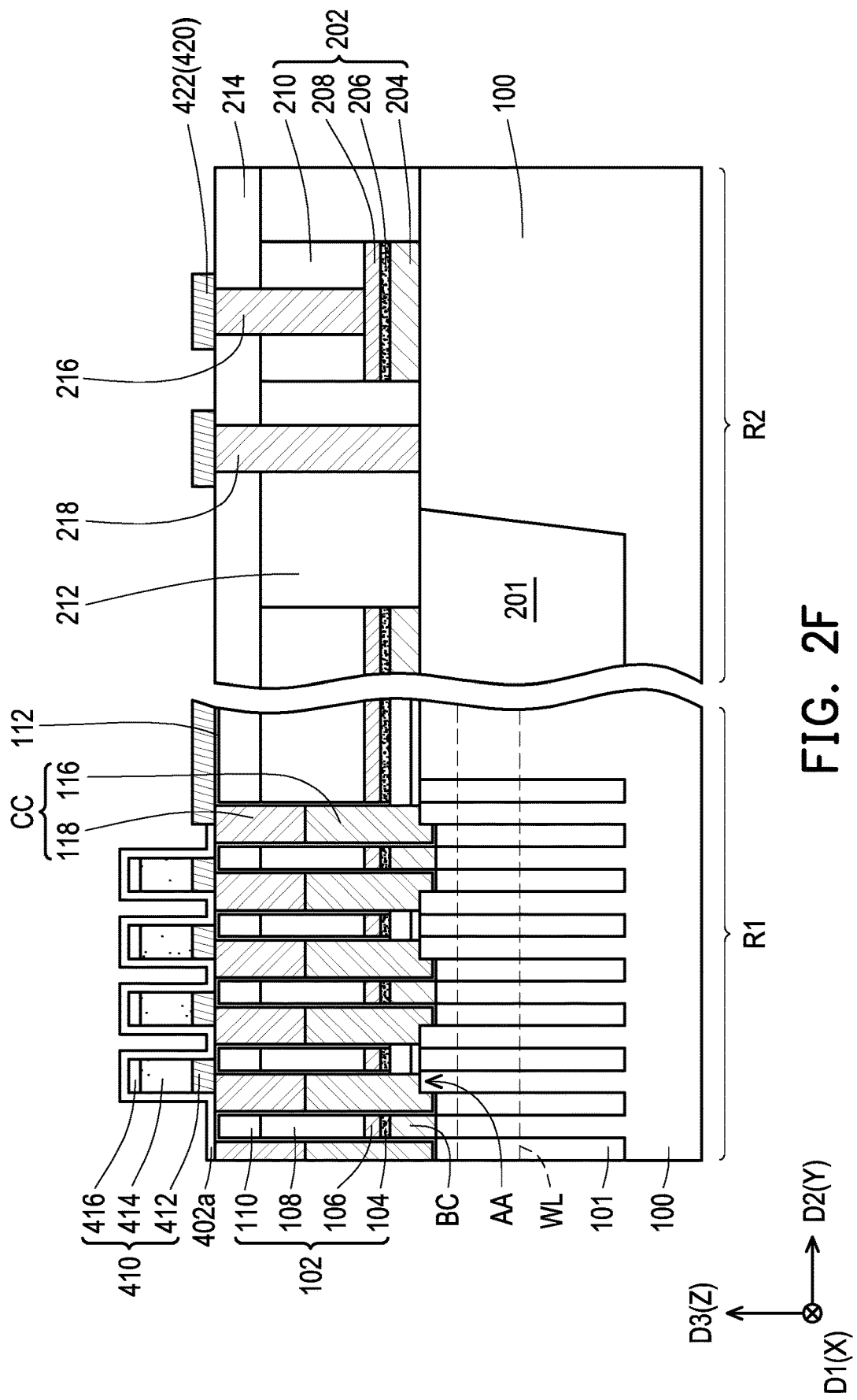

Referring to FIG. 2E and FIG. 2F, the protective material layer 402 is patterned to form a protective layer 402a conformally covering the surface of the first stack-layered structures 410. In one embodiment, the protective material layer 402 is patterned by following steps: forming a mask pattern to cover the surface of the first stack-layered structures 410; and performing an etching process by using the mask pattern as a mask to remove a portion of the protective material layer 402 and the first dielectric layer 426 and the first carbon layer 424 in the second stack-layered structures 420 that are not covered by the protective material layer 402. In this case, the metal layers 422 of the second stack-layered structures 420 and the dielectric layer 214 in the second region R2 are exposed.

Figure 2G:
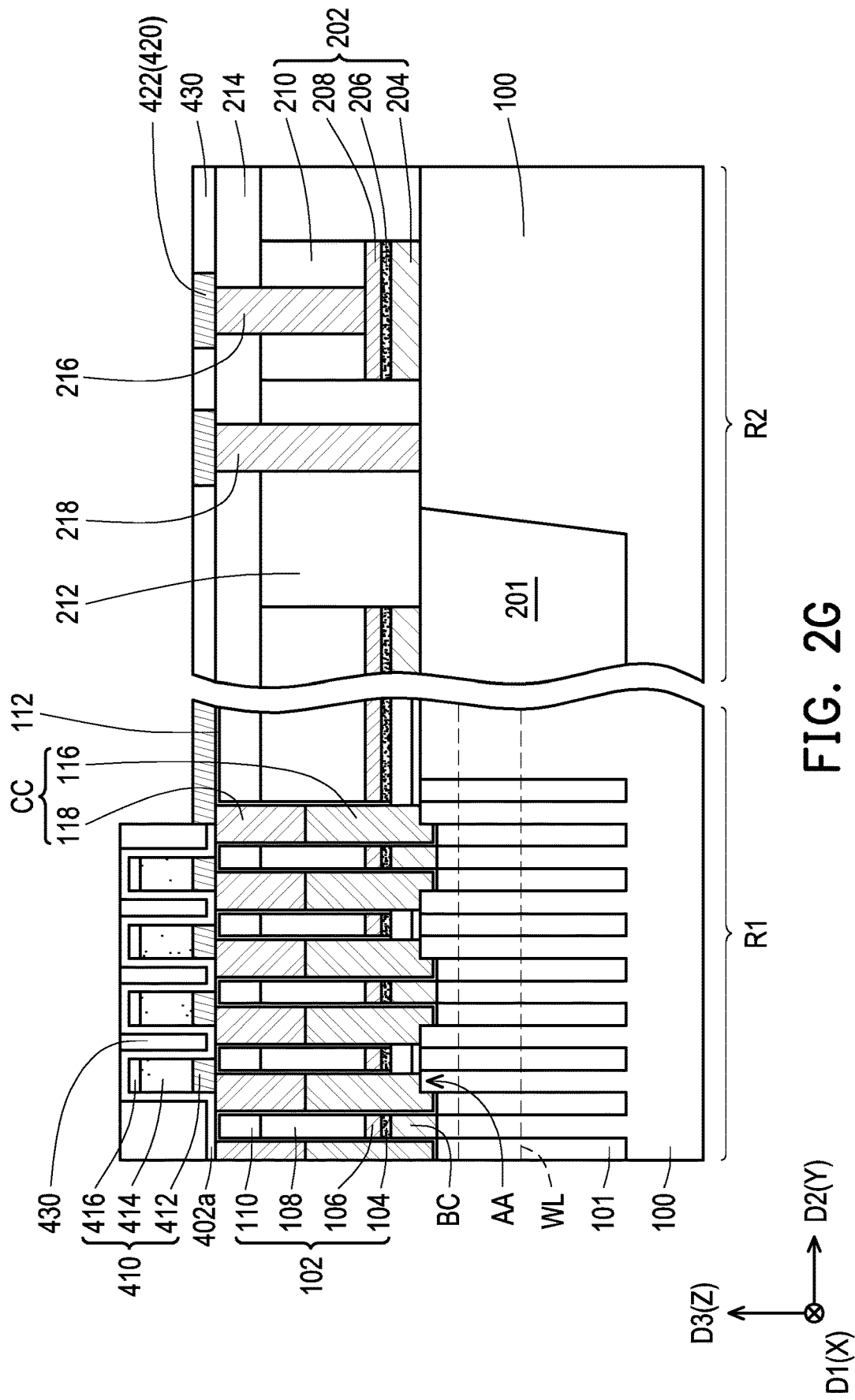

Referring to FIG. 2F and FIG. 2G, a filling layer 430 is formed on the protective layer 402a to fill in the space between the first stack-layered structures 410. In addition, the filling layer 430 is also formed in the space between the second stack-layered structures 420 in the second region R2. In one embodiment, a material of the filling layer 430 includes a dielectric material, such as silicon nitride. A method of forming the filling layer 430 includes: forming a filling material layer; and performing an etch-back process to remove a portion of the filling material layer to expose the top surfaces of the protective layer 402a and the metal layers 422. In the present embodiment, the filling layer 430 and the protective layer 402a have different dielectric materials.

Figure 2H:
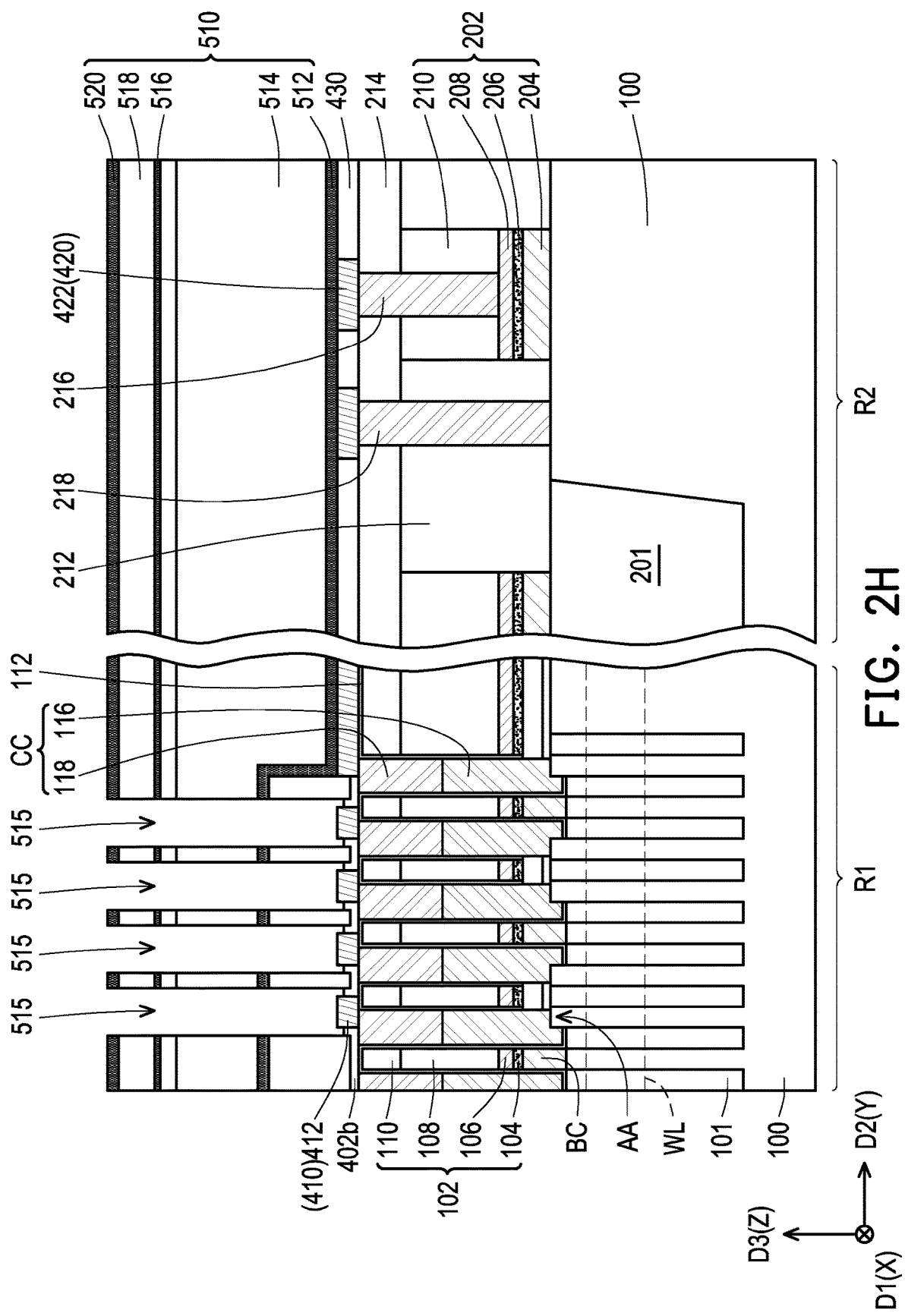

Referring to FIG. 2H, a second layered stack 510 is formed on the substrate 100 in the first region R1 and the second region R2. Specifically, the second layered stack 510 includes a lower support layer 512, a first template layer 514, a middle support layer 516, a second template layer 518, and an upper support layer 520 in order from bottom to top. In an embodiment, the material of the lower support layer 512, the middle support layer 516, and the upper support layer 520 is different from the material of the first template layer 514 and the second template layer 518. For example, the material of the lower support layer 512, the middle support layer 516, and the upper support layer 520 includes nitride, and the material of the first template layer 514 and the second template layer 518 includes oxide. In the embodiment, the lower support layer 512, the middle support layer 516, and the upper support layer 520 each include a silicon nitride layer, the first template layer 514 may include a BPSG layer, a TEOS layer, or a combination thereof, and the second template layer 518 may include $SiH_4$ Oxide layer.

Next, the second layered stack 510 is patterned to form a plurality of openings 515 in the first region R1. As shown in FIG. 2H, the openings 515 penetrate through the second layered stack 510 and extend down into the first stack-layered structures 410 to respectively expose the metal layers 412 in the first stack-layered structures 410. In such embodiment, the metal layers 412 may be referred to as landing pads between the capacitor contacts CC and the capacitors formed subsequently to connect the capacitor contacts CC and the capacitors, hereinafter called as the landing pads 412. In addition, during the said patterning process, a portion of the protective layer 402a is also removed to form a protective layer 402b covering the sidewalls of the metal layers 412. The protective layer 402b connects two adjacent landing pads 412 to form a U-shaped structure, and the filling layer 430 is disposed between the protective layer 402b and the lower support layer 512.

Thereafter, a capacitor formation process is performed to form a plurality of capacitors 530 in the openings 515, as shown in FIG. 2I to FIG. 2M.

Figure 2I:
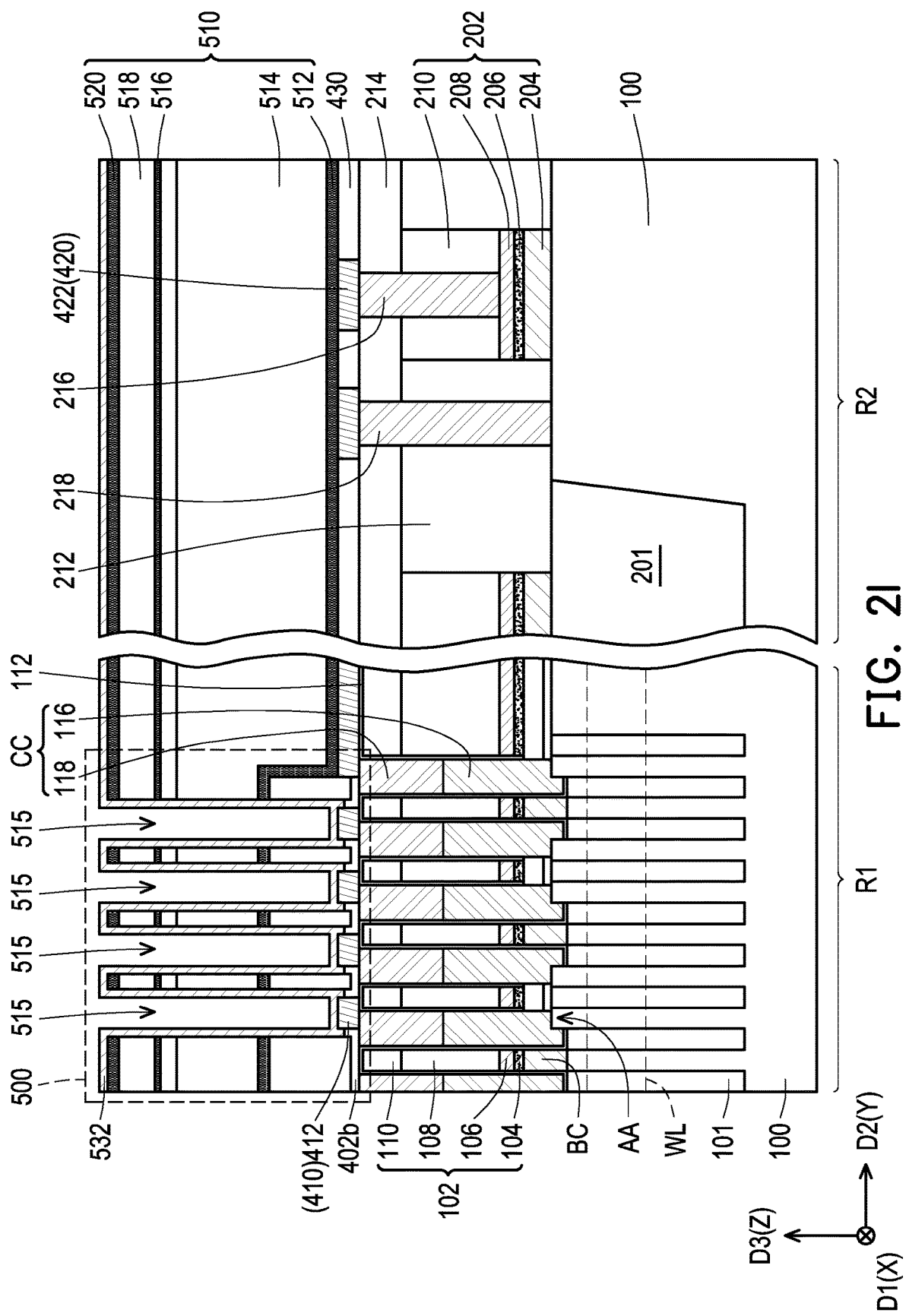

Referring to FIG. 2I, a lower electrode material layer 532 is formed on the substrate 100. The lower electrode material layer 532 conformally covers the surfaces of the openings 515 and the second layered stack 510. In one embodiment, a material of the lower electrode material layer 532 includes a conductive material, such as titanium nitride, tantalum nitride, tungsten, titanium tungsten, aluminum, copper, or metal silicide.

For the clarity of the figures, the following FIG. 2J to FIG. 2M only illustrate the enlarged region 500 of FIG. 2I. The underlying structure below the landing pads 412, the filling layer 430, and the protective layer 402b is denoted by reference numeral 10.

Figure 2J:
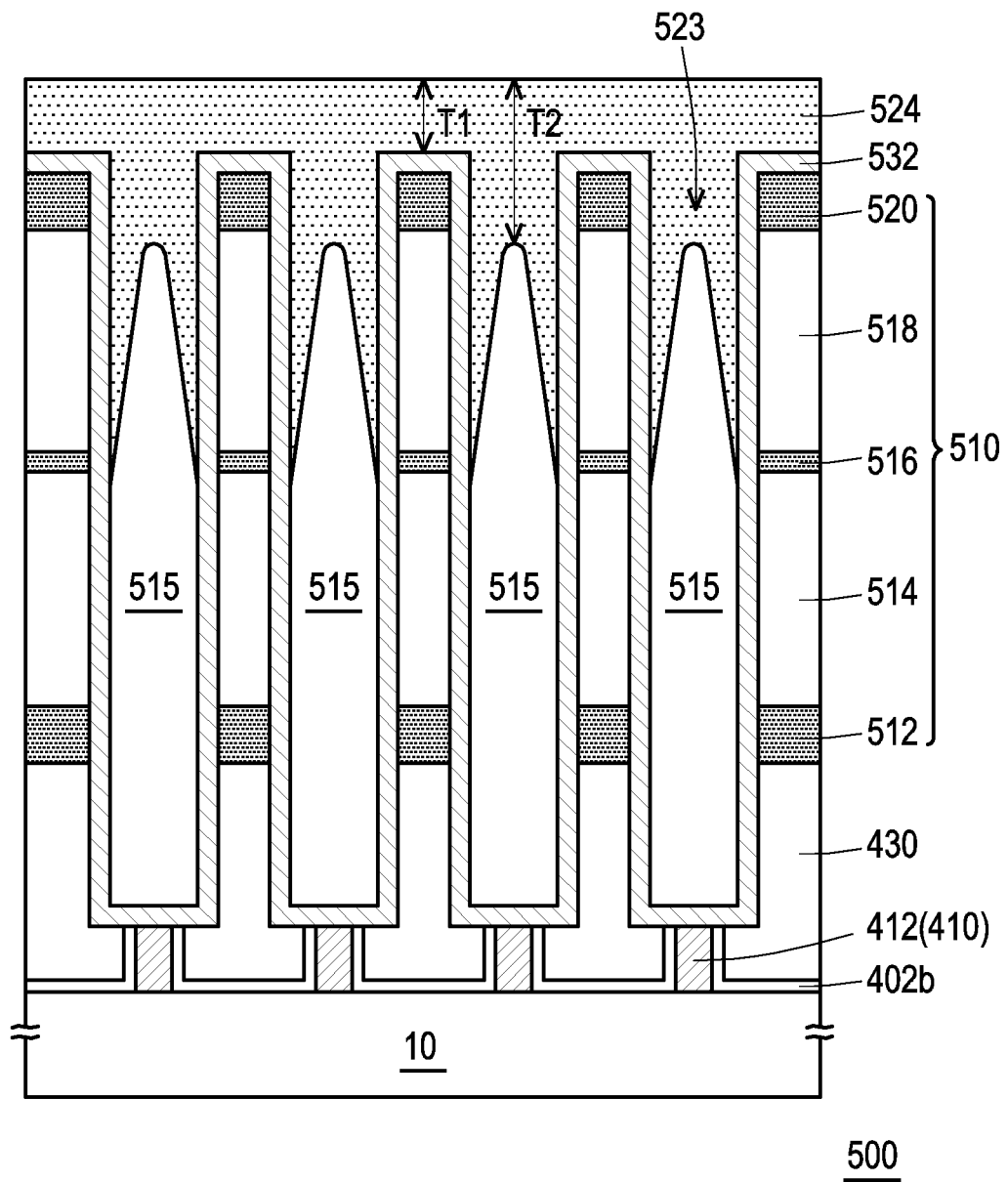

Referring to FIG. 2J, a mask layer 524 is formed on the lower electrode material layer 532. In one embodiment, a material of the mask layer 524 includes a dielectric material, such as silicon oxide. Since the size of the openings 515 is quite small and the mask layer 524 has poor step coverage, the upper sidewalls of the openings 515 are covered by the mask layer 524 and the tops of the openings 515 are sealed by the overhang 523 of the mask layer 524 without filling up the openings 515. In one embodiment, a thickness T1 of the mask layer 524 on the upper support layer 520 is less than a thickness T2 of the mask layer 524 on the opening 515.

Figure 2K:
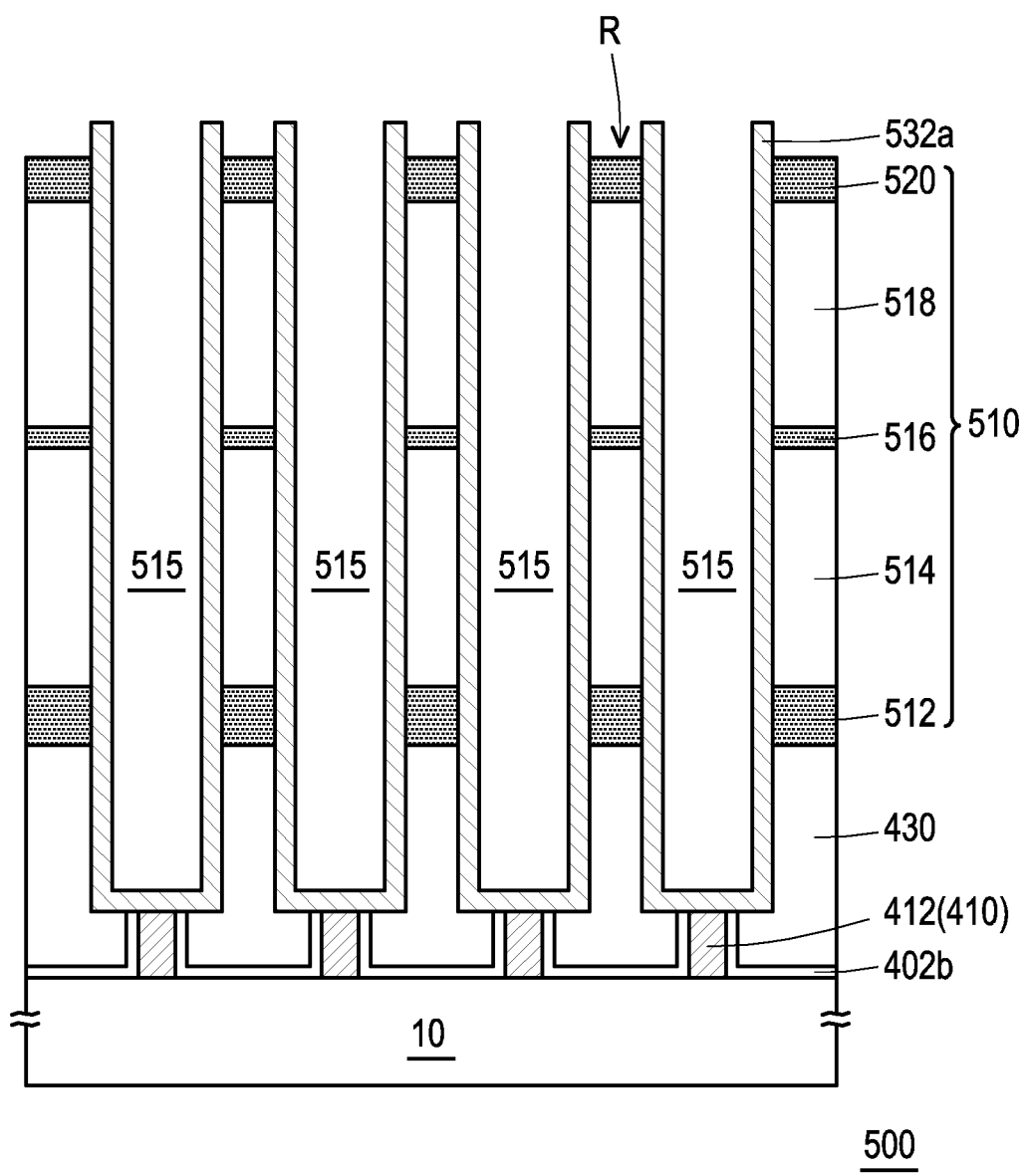

Referring to FIG. 2K, an etch-back process is performed on the mask layer 524. Since the thickness T1 of the mask layer 524 on the upper support layer 520 is relatively thin, the lower electrode material layer 532 is exposed first during the etching process, while the top ends of the openings 515 are still covered by the mask layer 524. Therefore, the mask layer 524 can protect the lower electrode material layer 532 in the openings 515. Next, the lower electrode material layer 532 above the upper support layer 520 and a portion of the underlying upper support layer 520 are etched to form a plurality of recesses R in this cross section. In this case, a plurality of cup-shaped lower electrodes 532a separated from each other are formed in the openings 515, respectively. A top view shape of the cup-shaped lower electrode 532a may be, for example, circular, oval, or polygonal, while a cross-sectional shape of the cup-shaped lower electrode 532a may be U-shaped, for example. The upper portion of the cup-shaped lower electrodes 532a may protrude from the upper support layer 520. However, the present invention is not limited thereto. In other embodiments, the upper support layer 520 and the cup-shaped lower electrodes 532*a* may have flush top surfaces.

After the cup-shaped lower electrodes 532*a* are formed, openings exposing the first template layer 514 and the second template layer 518 may be formed in another cross-sectional view to perform the subsequent mold stripping step, which will not be described in detail here.

Figure 2L:
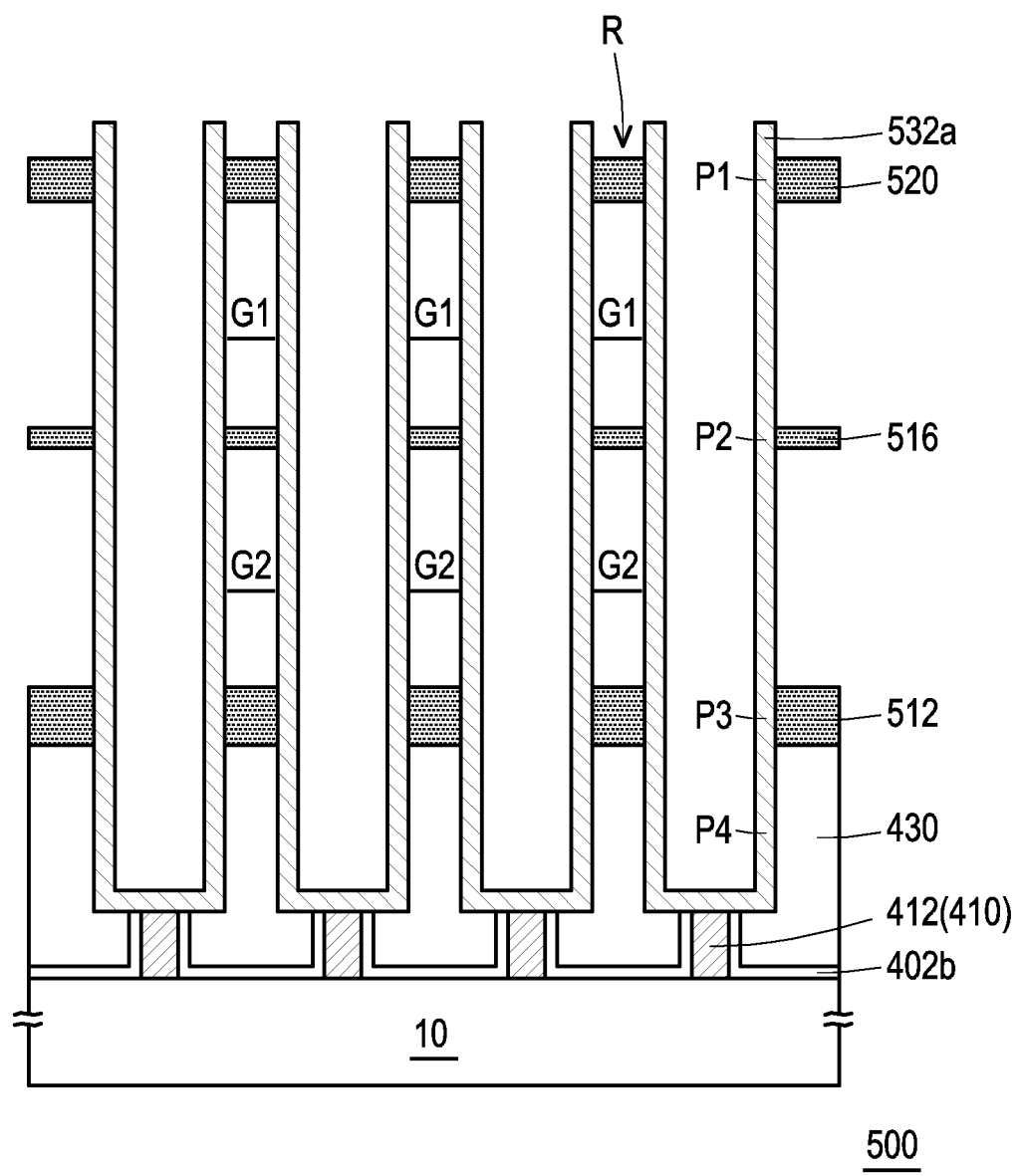

Referring to FIG. 2L, a mold stripping step is performed to remove the first template layer 514 and the second template layer 518, thereby exposing the inner surface and the outer surface of the cup-shaped lower electrodes 532*a*. Since the material of the first template layer 514 and the second template layer 518 (e.g., oxide) is different from the material of the lower support layer 512, the middle support layer 516, and the upper support layer 520 (e.g., nitride), the materials have a high etching selection ratio (e.g., between 4 and 6) during the etching. Therefore, the first template layer 514 and the second template layer 518 may be removed through selective etching, while leaving the lower support layer 512, middle support layer 516, and upper support layer 520. In an embodiment, the mold stripping step includes performing a wet etching process by using an etchant having a buffer oxide etchant (BOE), hydrofluoric acid (HF), diluted hydrofluoric acid (DHF), buffered hydrofluoric acid (BHF), or the like.

After the mold stripping step, a hollowed-out structure is formed. Both the inner surface and the outer surface of the cup-shaped lower electrodes 532*a* are exposed. In other words, as shown in FIG. 2L, gaps G1 may be formed between the middle support layer 516 and the upper support layer 520, and gaps G2 may be formed between the lower support layer 512 and the middle support layer 516, so as to effectively increase the surface area of the capacitor, thereby increasing the capacitance.

The lower support layer 512, the middle support layer 516, the upper support layer 520, and the filling layer 430 support the plurality of cup-shaped lower electrodes 532*a*. Specifically, the upper support layer 520 surrounds and connects a first portion P1 of the cup-shaped lower electrodes 532*a*, the middle support layer 516 surrounds a second portion P2 of the cup-shaped lower electrodes 532*a*, the lower support layer 512 surrounds a third portion P3 of the cup-shaped lower electrodes 532*a*, and the filling layer 430 surrounds a fourth portion P4 of the cup-shaped lower electrodes 532*a*. In one embodiment, the first portion P1 is higher than the second portion P2, the second portion P2 is higher than the third portion P3, and the third portion P3 is higher than the fourth portion P4. In the present embodiment, the lower support layer 512 is in direct contact with the filling layer 430.

Figure 2M:
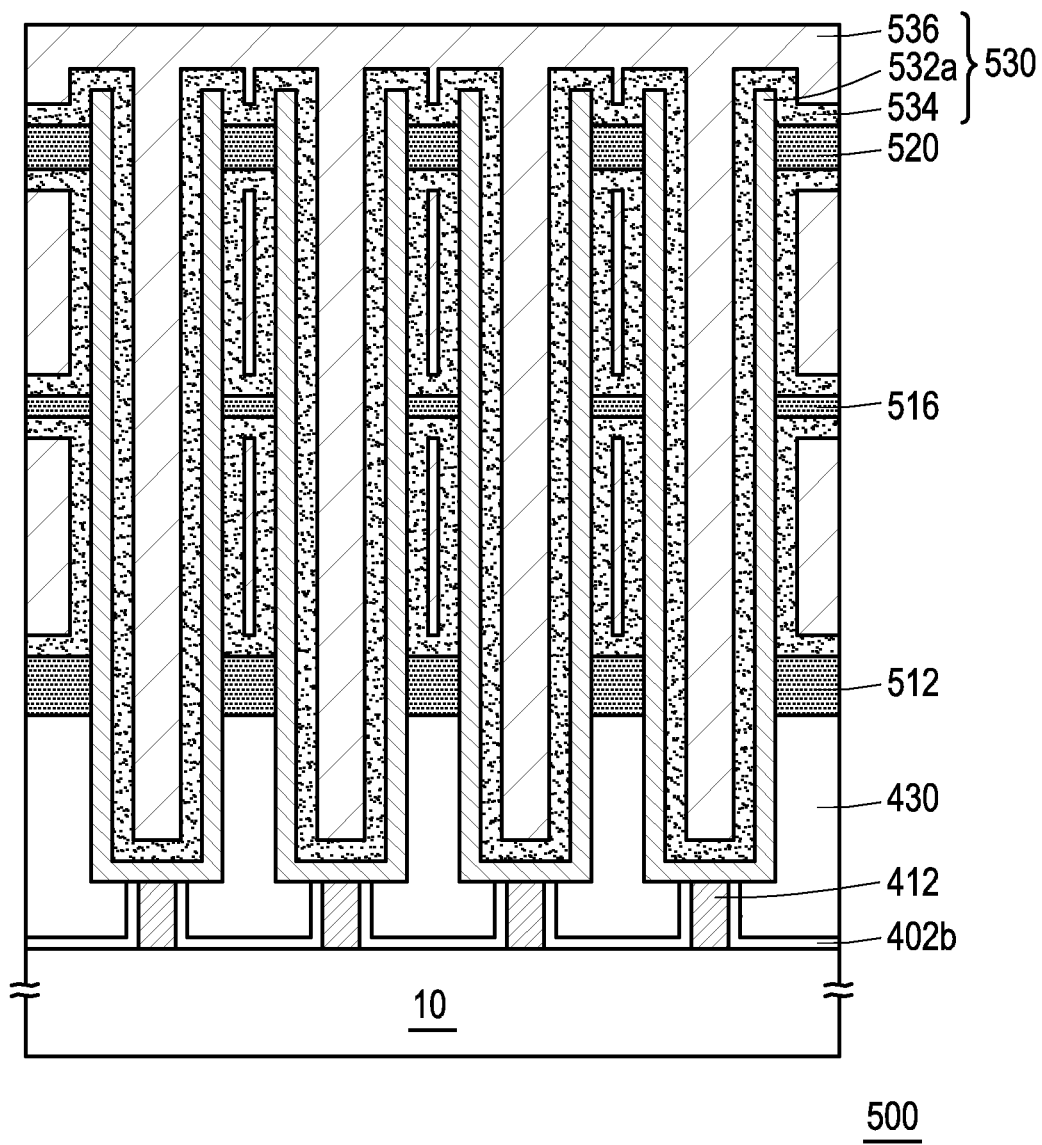

Referring to FIG. 2M, after the mold stripping step, a capacitor dielectric layer 534 is formed on the inner and outer surfaces of the cup-shaped lower electrodes 532*a*, the surface of the lower support layer 512, the surface of the middle support layer 516, and the surface of the upper support layer 520. It should be noted that, in the present embodiment, the cup-shaped bottom electrodes 532*a* further extends into the filling layer 430, so that the capacitor dielectric layer 534 further extends to cover a portion of the surface of the filling layer 430, thereby increasing the capacitor area in the vertical direction.

Next, an upper electrode 536 is formed on the surface of the capacitor dielectric layer 534. The cup-shaped lower electrodes 532*a*, the capacitor dielectric layer 534, and the upper electrode 536 may constitute capacitors 530. The capacitor dielectric layer 534 includes a high-k material layer, which may be, for instance, hafnium oxide (HfO), zirconium oxide (ZrO), aluminum oxide (AlO), aluminum nitride (AlN), titanium oxide (TiO), lanthanum oxide (LaO), yttrium oxide (YO), gadolinium oxide (GdO), tantalum oxide (TaO), or a combination thereof. A material of the upper electrode 536 may include metal, metal nitride or metal alloy, such as titanium nitride (TiN), tantalum nitride (TaN), tungsten (W), titanium tungsten (TiW), aluminum (Al), copper (Cu) or metal silicide.

In summary, in the present invention, the height of the filling layer is increased by adding the first layered stack with additional carbon material layer and dielectric material layer. In this case, the capacitor dielectric layer can not only conformally cover the surface of the upper support layer, the surface of the middle support layer, and the surface of the lower support layer, but also further extends to cover a portion of the surface of the filling layer, so as to enhance the capacitor area in the vertical direction, thereby enhancing the capacitance of the memory device.

What is claimed is:

1. A memory device, comprising:
   a plurality of landing pads, disposed on a substrate, wherein a material of the plurality of landing pads includes metal;
   a protective layer, conformally covering sidewalls of the plurality of landing pads, wherein the protective layer physically connects two adjacent landing pads to form a U-shaped structure;
   a filling layer, laterally disposed between the plurality of landing pads, wherein a top surface of the filling layer is higher than a top surface of the plurality of landing pads;
   a plurality of cup-shaped lower electrodes, respectively disposed on the plurality of landing pads;
   a capacitor dielectric layer, covering a surface of the plurality of cup-shaped lower electrodes; and
   an upper electrode, covering a surface of the capacitor dielectric layer.

2. The memory device according to claim 1, further comprising a support structure, wherein the support structure comprises:
   an upper support layer, surrounding a first portion of the plurality of cup-shaped lower electrodes;
   a middle support layer, surrounding a second portion of the plurality of cup-shaped lower electrodes; and
   a lower support layer, surrounding a third portion of the plurality of cup-shaped lower electrodes, wherein the capacitor dielectric layer conformally covers a surface of the upper support layer, a surface of the middle support layer, and a surface of the lower support layer, and further extends to cover a portion of a surface of the filling layer.

3. The memory device according to claim 2, wherein the filling layer surrounds a fourth portion of the plurality of cup-shaped lower electrodes, the first portion is higher than the second portion, the second portion is higher than the third portion, and the third portion is higher than the fourth portion.

4. The memory device according to claim 2, wherein the lower support layer is in direct contact with the filling layer.

5. The memory device according to claim 2, wherein a material of the upper support layer, the middle support layer, and the lower support layer comprises a nitride.

6. The memory device according to claim 2, wherein the filling layer is disposed between the protective layer and the lower support layer.

7. The memory device according to claim 1, wherein the protective layer comprises an atomic layer deposition (ALD) oxide layer.

8. A method of forming a memory device, comprising:
providing a substrate having a first region and a second region;
forming a first layered stack on the substrate in the first region and the second region, wherein the first layered stack comprises a metal material layer, a first carbon material layer, a first dielectric material layer, a second carbon material layer, and a second dielectric material layer;
patterning the first layered stack to form a plurality of first stack-layered structures on the substrate in the first region, wherein each first stack-layered structure comprises a metal layer, a first carbon layer, and a first dielectric layer;
performing an atomic layer deposition (ALD) process on the plurality of first stack-layered structures to form a protective layer conformally covering a surface of the plurality of first stack-layered structures;
forming a filling layer on the protective layer to fill in a space between the plurality of first stack-layered structures;
forming a second layered stack on the substrate in the first region and the second region;
patterning the second layered stack to form a plurality of openings in the first region, wherein the plurality of openings respectively expose a plurality of metal layers of the plurality of first stack-layered structures; and
performing a capacitor formation process to form a plurality of capacitors in the plurality of openings.

9. The method of forming the memory device according to claim 8, after patterning the first layered stack, the method further comprises forming a plurality of second stack-layered structures on the substrate in the second region, wherein the plurality of second stack-layered structures are at the same level with the plurality of first stack-layered structures.

10. The method of forming the memory device according to claim 9, wherein the filling layer further fills in a space between the plurality of second stack- layered structures of the second region.

11. The method of forming the memory device according to claim 8, wherein the filling layer and the protective layer have different dielectric materials.

12. The method of forming the memory device according to claim 11, wherein the filling layer comprises a silicon nitride layer, and the protective layer comprises an oxide layer by atomic layer deposition (ALD) process.

13. The method of forming the memory device according to claim 8, wherein the second layered stack sequentially from bottom to top comprises: a lower support layer, a first template layer, a middle support layer, a second template layer, and an upper support layer, and a material of the lower support layer, the middle support layer, and the upper support layer is different from a material of the first template layer and the second template layer.

14. The method of forming the memory device according to claim 13, wherein the lower support layer is in direct contact with the filling layer.

15. The method of forming the memory device according to claim 13, wherein the performing the capacitor formation process comprises:
forming a plurality of cup-shaped lower electrodes in the plurality of openings to contact the plurality of metal layers;
performing a mold stripping step to expose an inner surface and an outer surface of the plurality of cup-shaped lower electrodes;
forming a capacitor dielectric layer on the inner surface and the outer surface of the plurality of cup-shaped lower electrodes, a surface of the upper support layer, a surface of the middle support layer, and a surface of the lower support layer; and
forming an upper electrode on a surface of the capacitor dielectric layer.

16. The method of forming the memory device according to claim 15, wherein the mold stripping step comprises:
performing a wet etching process with an etchant to remove the first template layer and the second template layer, wherein the etchant comprises a buffer oxide etchant (BOE), hydrofluoric acid (HF), diluted hydrofluoric acid (DHF), buffered hydrofluoric acid (BHF), or a combination thereof.

17. The method of forming the memory device according to claim 8, wherein the plurality of metal layers are to form a plurality of landing pads connecting directly with the plurality of capacitors .

18. The method of forming the memory device according to claim 8, wherein the first region comprises a memory array region, and the second region comprises a peripheral circuit region.

19. The method of forming the memory device according to claim 18, further comprising a plurality of capacitor contacts disposed in the memory array region, wherein the plurality of capacitor contacts are electrically connected to the plurality of capacitors, respectively.

20. The method of forming the memory device according to claim 18, further comprising a plurality of gate structures disposed in the peripheral circuit region.

* * * * *